US006879184B1

(12) United States Patent
Fisk

(10) Patent No.: US 6,879,184 B1
(45) Date of Patent: Apr. 12, 2005

(54) PROGRAMMABLE LOGIC DEVICE ARCHITECTURE BASED ON ARRAYS OF LUT-BASED BOOLEAN TERMS

(75) Inventor: Mathew A. Fisk, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 98 days.

(21) Appl. No.: 10/417,290

(22) Filed: Apr. 16, 2003

Related U.S. Application Data

(60) Provisional application No. 60/430,616, filed on Dec. 3, 2002.

(51) Int. Cl.[7] ...................... H01L 25/00; H03K 19/177; H03K 17/693; G06F 17/50

(52) U.S. Cl. ........................................... 326/41; 716/16

(58) Field of Search ............................. 326/41, 38, 39, 326/47, 40; 708/232; 716/16, 17, 12

(56) References Cited

U.S. PATENT DOCUMENTS 6,275,064 B1 * 8/2001 Agrawal et al. .............. 326/39
6,326,808 B1 12/2001 Fisk et al.
6,480,023 B1 * 11/2002 Kaviani ....................... 326/38
6,603,332 B2 * 8/2003 Kaviani et al. ............... 326/39
6,747,480 B1 * 6/2004 Kaptanoglu et al. .......... 326/41
6,754,686 B1 * 6/2004 Kaviani ...................... 708/232
6,798,240 B1 * 9/2004 Pedersen ..................... 326/39

* cited by examiner

*Primary Examiner*—Patrick Wamsley
(74) *Attorney, Agent, or Firm*—Steve Mendelsohn

(57) ABSTRACT

Multiple product terms (PTs) are combined with a multiple-input look-up table (LUT) to form a LUT-based Boolean term (LBT) that generates a Boolean output. Multiple LBTs are combined with one or more sum terms to form an enhanced generic logic block (EGLB) that can be programmed to operate, e.g., as a sum-of-products structure, where the EGLB structure can be repeated within a programmable logic device (PLD). Different multi-bit Boolean functions can be implemented in a single pass through each EGLB, with fewer resources then prior art structures. Multiple LBTs can be combined with other logic to form combined LBTs (CLBTs). This invention can provide improved Boolean function packing density compared to existing PLD architectures and/or shorter delays for a comparable packing density.

21 Claims, 8 Drawing Sheets

TABLE 1

| Inputs | | Two-input LUT output for each input combination | | | | | | | | | | | | | | | |
|---|---|---|---|---|---|---|---|---|---|---|---|---|---|---|---|---|---|
| A | B | ZERO | NOR | AND (invert B) | AND (invert A) | AND | Invert B | Invert A | XNOR | XOR | A | B | OR | NAND (Invert B) | NAND (Invert A) | NAND | ONE |
| 0 | 0 | 0 | 1 | 0 | 0 | 0 | 1 | 1 | 1 | 0 | 0 | 0 | 0 | 1 | 1 | 1 | 1 |
| 1 | 0 | 0 | 0 | 1 | 0 | 0 | 1 | 0 | 0 | 1 | 1 | 0 | 1 | 0 | 1 | 1 | 1 |
| 0 | 1 | 0 | 0 | 0 | 1 | 0 | 0 | 1 | 0 | 1 | 0 | 1 | 1 | 1 | 0 | 1 | 1 |
| 1 | 1 | 0 | 0 | 0 | 0 | 1 | 0 | 0 | 1 | 0 | 1 | 1 | 1 | 1 | 1 | 0 | 1 |
| Control (4-bits) | | 0 | 1 | 2 | 3 | 4 | 5 | 6 | 7 | 8 | 9 | A | B | C | D | E | F |

FIG. 3

PROGRAMMABLE LOGIC DEVICE ARCHITECTURE BASED ON ARRAYS OF LUT-BASED BOOLEAN TERMS

CROSS-REFERENCE TO RELATED APPLICATIONS

This application claims the benefit of the filing date of U.S. provisional applications No. 60/430,616, filed on Dec. 3, 2002.

TECHNICAL FIELD

The present invention relates to integrated circuits and, more particularly, to programmable logic devices.

BACKGROUND

State-of-the-art complex programmable logic devices (CPLDs) typically incorporate a basic sum-of-products architecture where two or more product terms are followed by a sum term to support different combinatorial (e.g., Boolean) functions. An AND gate generates the combinatorial product of its inputs, while an OR gate generates the combinatorial sum of its inputs. A product term (PT) is a configuration of AND gates that combine to generate a single combinatorial product of the inputs to that AND gate configuration. Similarly, a sum term (ST) is a configuration of OR gates that combine to generate a single combinatorial sum of the inputs to that OR gate configuration. The basic sum of products structure of multiple product terms feeding a single sum term, commonly referred to as a generic logic block (GLB), is typically repeated multiple times within a CPLD, with each GLB programmably interconnected via routing resources with other GLBs and with the CPLD inputs and outputs. A Boolean product/sum term of N inputs typically requires on the order of 2N AND/OR gates to implement. For a given CPLD, a limited number of gates are available to implement GLBs.

One metric of recent importance in programmable logic devices is the PT width, i.e., the total number of inputs that are available to a given product term within the device to generate a single PT output.

Another important metric for programmable logic devices is the ST width, i.e., the total number of product terms that are available to a given sum term within the device to generate a single sum-of-products output.

The trend toward wider address and data/control busses in recent microprocessor designs has led to the desire for CPLDs that can implement wide PTs. Since wide PTs are more expensive in gate count than narrow PTs, these devices typically implement this capability at the cost of the total number of PTs available.

Various approaches to this problem have been used, with limited success. One such approach involves supporting the cascading of narrow GLBs, i.e., GLBs that support narrow-width PTs. In this approach, some of the inputs of a wide Boolean function maybe fed to a narrow GLB where a first PT output is formed. This PT output is then input to another narrow GLB. This second GLB also receives the remaining inputs of the function, thereby forming the equivalent of a single, wide GLB. Disadvantages of this approach include the delays that result from routing signals from the output of the first narrow GLB to the input of the second narrow GLB and the delays associated with passing some signals sequentially through multiple narrow GLBs. Other approaches such as adding levels of OR functions on the output, inverting PT outputs before feeding them to the OR array to increase the effective number of single-bit PTs, and using XOR functions in the output cells have also provided some additional flexibility, with corresponding trade-offs.

SUMMARY

Problems in the prior art are addressed in accordance with principles of one embodiment of the invention by combining two or more product terms (PTs) with a multiple-input look-up table (LUT) device to form a LUT-based Boolean term (LBT that is capable of generating a Boolean output from the inputs. Multiple LBTs may be combined with one or more sum terms to form an enhanced generic logic block (EGLB) that can be programmed to operate, e.g., as a sum-of-products structure, where the EGLB structure can be repeated multiple times within a complex programmable logic device (CPLD). The invention enables processing of multi-bit Boolean functions in a single pass through each EGLB, while providing the flexibility to implement different Boolean functions with fewer resources then prior art structures.

Alternative embodiments combine multiple LBTs with other logic to form combined LBTs (CLBTS) that trade off the maximum width of functions that can be supported in a single pass through the EGLB versus the number of LBTs that can be applied in parallel to a given set of inputs or outputs.

In certain embodiments, the selection of the LUT function that is executed by a multiple-input LUT and the width-selection mechanism of certain CLBTs may be chosen to be a dynamic function of the real-time results of one or more LBTs or CLBTs within the CPLD. This feature allows on-the-fly modification of the CPLD configuration in response to changes to the inputs to the device and/or internal results of logic within the device.

Use of the structures of this invention within a CPLD generally provides improved Boolean function packing density compared to existing CPLD architectures and/or shorter delays for a comparable packing density.

In one embodiment, the present invention is a programmable logic device (PLD) having one or more enhanced generic logic blocks (EGLBs). Each EGLB includes (a) a LUT-based Boolean term (LBT) array connected to receive a plurality of array input signals and generate one or more array output signals, where each array output signal corresponds to a combinatorial function of one or more of the array input signals and (b) one or more sum terms, where each sum term is connected to receive one or more of the array output signals and generate a combinatorial sum of its input signals. The LBT array within the EGLB includes a plurality of selection elements and a plurality of LBTs. Each of the selection elements is adapted to selectively provide one or more of the array input signals to an LBT. Each LBT comprises P product terms and a P-input look-up table (P-LUT) where (1) P is an integer greater than one, (2) each product term is adapted to generate a combinatorial product of one or more array input signals selectively provided by a corresponding selection element, and (3) each P-LUT is connected to receive the combinatorial products from the corresponding P product terms and generate a programmable combinatorial function of the P product terms.

BRIEF DESCRIPTION OF THE DRAWINGS

Other aspects, features, and advantages of the present invention will become more fully apparent from the following detailed description, the appended claims, and the accompanying drawings in which:

FIG. 3 depicts TABLE 1 which summarizes the logic of the 2-LUT device that is included in one or more embodiments of this invention.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Prior Art Generic Logic Block

Figure 1:
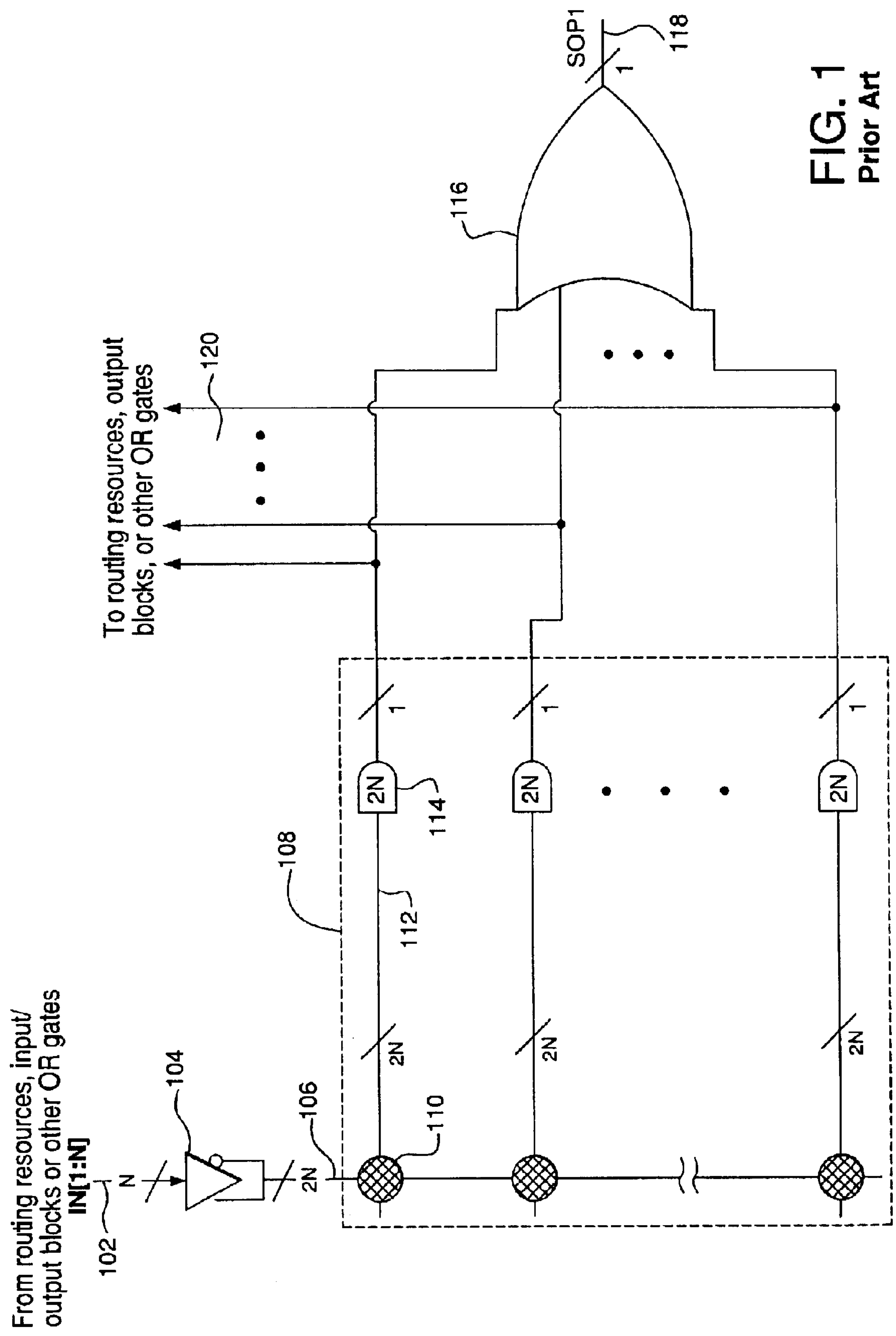
FIG. 1 is a block diagram of a sum-of-products macro-structure of the prior art.

FIG. 1 depicts a typical sum-of-products macro-structure of prior art CPLDs. This structure, optionally combined with additional logic gates, registers, and invert functions, is typically referred to in the industry as a generic logic block (GLB). As shown, N-bit wide input bus 102 feeds inverting and non-inverting element 104 to produce 2N signals for 2N-bit wide input bus 106, which feeds product-term array 108 with both inverted and non-inverted versions of each of the N inputs provided by input bus 102. Within product-term array 108, each 2N-bit wide product term (PT) 114 may be selectively fed via selection element 110 with one or more of the 2N binary inputs provided to product-term array 108. Each selection element 110 is a matrix of fuses or an equivalent programmable connection mechanism that allows programmable connection or non-connection between 2N-bit wide input bus 106 and a corresponding 2N-bit wide internal bus 112 independently, on a bit-by-bit basis, to provide selected input signals to a corresponding PT 114. A no-connect on a particular input of a product term is set to a logical one (e.g., pulled high) so that it has no effect on the Boolean AND operation performed by the PT.

Each PT 114 supports the Boolean product of a maximum of 2N inputs and requires on the order of 2N gates to be implemented as a balanced tree of two-input AND gates. Alternative implementations are also possible (e.g., NOR gates and sense amps). In practical applications of CPLDs that use structures of the type shown in FIG. 1, each selection element 110 is generally programmed to select no more than half of the 2N inputs for the corresponding PT 114 to AND together. This is because, of the 2N inputs, N are independent signals and N are complements of the independent signals. Thus, the product of any more than N of these signals will always include the product of a signal and its complement, which by definition, is zero. Nevertheless, the gate count is based on the full 2N-bit width supported.

During use of the device, each selection element 110 is programmed to choose a subset of the signals on 2N-bit wide input bus 106 to feed to its corresponding PT 114. Typically, associated with each PT array 108 are a number of sum terms (which form an ST array). Each of these sum terms receives one or more outputs of PT array 108. For clarity of illustration, only one of these sum terms, ST 116, is shown in FIG. 1. As illustrated, the outputs of PT array 108 feed ST 116 to produce sum-of-products (SOP) output SOP1 118. One or more of the PT array outputs may also be fed out (120) of the local GLB to a global routing resource (GRR), device output cells, other GLBs, and/or other sum terms to create additional SOP outputs. A GRR is a general-purpose, fully or partially non-blocking, programmable interconnect system that is typically employed in CPLDs to route signals between CPLD inputs, outputs, and GLBs.

Although represented in FIG. 1 using a single "AND gate" symbol and a single "OR gate" symbol, those skilled in the art will understand that each product term 114 and sum term 116 are typically implemented using a configuration of multiple AND gates and a configuration of multiple OR gates, respectively.

Enhanced GLB

Figure 2:
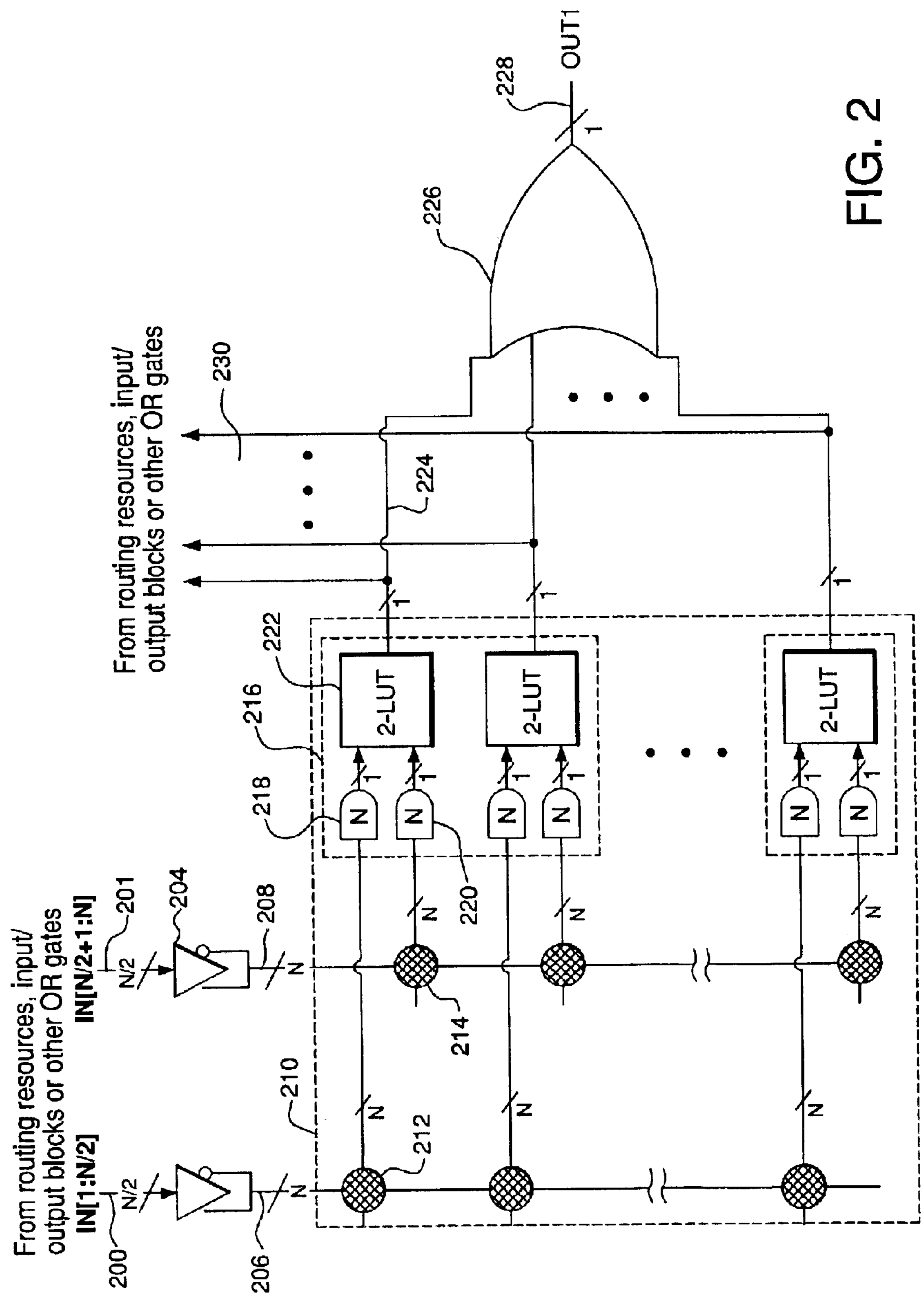
FIG. 2 is a block diagram of an enhanced generic logic block (EGLB) featuring LUT-based product terms (LBTs) according to one embodiment of this invention.

FIG. 2 depicts an enhanced product-term array 210 and supporting logic, according to one embodiment of the present invention. The enhanced PT array is combined with OR gates, registers, XORs, and invert functions to form an enhanced generic logic block (EGLB). As shown, N/2-bit wide input bus 200 feeds inverting and non-inverting element 202 to produce N signals for N-bit wide input bus 206, which feeds enhanced product-term array 210. Similarly, N/2-bit wide input bus 201 feeds inverting and non-inverting element 204 to produce N signals for N-bit wide input bus 208, which also feeds enhanced product-term array 210.

Within enhanced product-term array 210, each N-bit wide product term (PT) 218 maybe fed with a subset of the N binary inputs-206 via its corresponding selection element 212. Similarly, each N-bit wide PT 220 may be fed with a subset of the N binary inputs 208 by its corresponding selection element 214. As in the prior art, each of the selection elements 212 and 214 is a matrix of fuses or an equivalent programmable connection mechanism. Selection element 212 allows programmable connection or non-connection on a bit-by-bit basis between N-bit wide input bus 206 and the corresponding PT 218. Similarly, selection element 214 allows programmable connection or non-connection between N-bit wide input bus 208 and the corresponding PT 220 on a bit-by-bit basis. A no-connect on the input of a PT is pulled high so that it has no effect on the Boolean AND operation performed by the PT.

Each of PTs 218 and 220 feeds a two-input look-up table (2-LUT) 222. In one implementation, each 2-LUT is controlled by four binary control bits (not illustrated) to allow the selection of one of 16 possible binary output functions of the two PT inputs of the 2-LUT. Sixteen possible output functions are documented in TABLE 1 of FIG. 3, where A and B refer to the PT inputs from PTs 218 and 220, respectively. The control bits are either provided from an interface external to the 2-LUT or they represent the outputs of programmable cells within the 2-LUT (e.g., memory elements or fuses similar to those used for selection elements 212 and 214).

The combination of two or more PTs and a multiple-input LUT to generate a single Boolean output term is referred to herein as a LUT-based Boolean term (LBT). Such a combination with two PTs feeding a 2-LUT is referred to herein as a 2-LBT. If P product terms are combined with a P-LUT, this is referred to as a P-LBT. If the width of each PT in a P-LBT is W, the LBT may be referred to as a WxP-LBT. Thus, each LBT 216 in FIG. 2 is, strictly speaking, an Nx2-LBT; however, generally it may also be referred to as an LBT or a 2-LBT.

Note that, although preferred implementations of this invention involve LUTs that are fed by multiple product terms of equal width, it is possible to have a LUT that combines PTs where the widths of one or more those PTs are different.

The configuration of selection elements 212 and 214 and multiple LBTs 216 in FIG. 2 form enhanced PT array 210, which is also referred to herein as LBT array 210. In this invention, it is typical to associate (at least one) local sum term 226 with each LBT array. Each local sum term receives one or more outputs from the LBT array to which it is associated. For clarity of illustration, only one local sum term is shown in FIG. 2. As illustrated, outputs 224 of LBT array 210 feed sum term 226 to produce output OUT1 228. LBT array outputs may also be fed out of the LBT array via expansion interface 230 to a global routing resource (GRR), device output cells, other EGLBs, and other local sum terms to create additional combinations. Thus, it is quite conceivable for the output of an LBT from one EGLB to drive the input of another LBT in another EGLB to form a cascade of LBTs. This functionality is desirable in some applications of the enhanced CPLD of this invention.

One such application, for example, is one that involves the Boolean product (i.e., AND) of more than N input signals. The product of the first N/2 of these more-than-N signals may be formed by PT 218 of LBT 216, and the product of the second N/2 signals may be formed by PT 220 of LBT 216. (Note that, although each of PTs 218 and 220 are fed with N signals, because these signals consist of N/2 inputs and their complements, in practice, the product of no more than N/2 of these inputs is ever formed by a PT at any given time). Next, the outputs of PTs 218 and 220 feed 2-LUT 222, where their Boolean product is produced (e.g., by configuring 2-LUT 222 to Option 4 in TABLE 1 of FIG. 3) and output to the GRR. The GRR then routes this output to the input of another instance of LBT array 210 in the CPLD, where it may be ANDed with up to N-1 other signals. If necessary, more than two LTB arrays maybe strung together in a similar manner.

Note that the benefit of a 2-input LUT with respect to, for example, a 3-input LUT is that the 2-input LUT is smaller and thus can better serve as a building block because it can be easily paired with other resources. Typical CPLDs architectures feature 10 and macrocell counts that are divisible by two. This is also true for the number of macrocells grouped per array (e.g., 4, 16, or 32). CPLDs are characterized by both the number of inputs and the number of product terms available to implement single pass functions. Cascading LBT's allows you to flexibly trade off between these two characteristics. A cascaded LBT can effectively double the number of inputs that can be ANDed together if the cascading occurs between LBTs, each of which has a different set of input signals available to it.

Combinations of LBTs (CLBTs)

In addition to the LBT interconnect possibilities described in the preceding section, according to embodiments of this invention, LBTs can also be combined in various ways to provide additional flexibility and efficiencies to the EGLBs to which they belong. Combinations of two or more LBTs with additional combinatorial logic are generally referred to herein as combined LBTs (CLBTs). One such CPLT is exemplified by the arrangement of FIG. 4. Here, the outputs of two LBTs 402 of an LBT array are combined via a two-input logic function 408 (e.g., AND, OR, XOR, NAND) to provide an additional output 410, which may be fed to one or more local sum terms. The LBT outputs 406 and 414 and additional output 410 may feed other elements of the CPLD through expansion outputs 404, 412, and 416. The CLBT of FIG. 4 may be referred to as a 2Nx2-CLBT, since the input width of each LBT 402 within the CLBT is 2N and the number of LBTs in the CLBT is two.

Note that, in this embodiment, two-input logic function 408 may itself be a 2-LUT device. Such an arrangement provides increased flexibility and capability to this CLBT.

Figure 5:
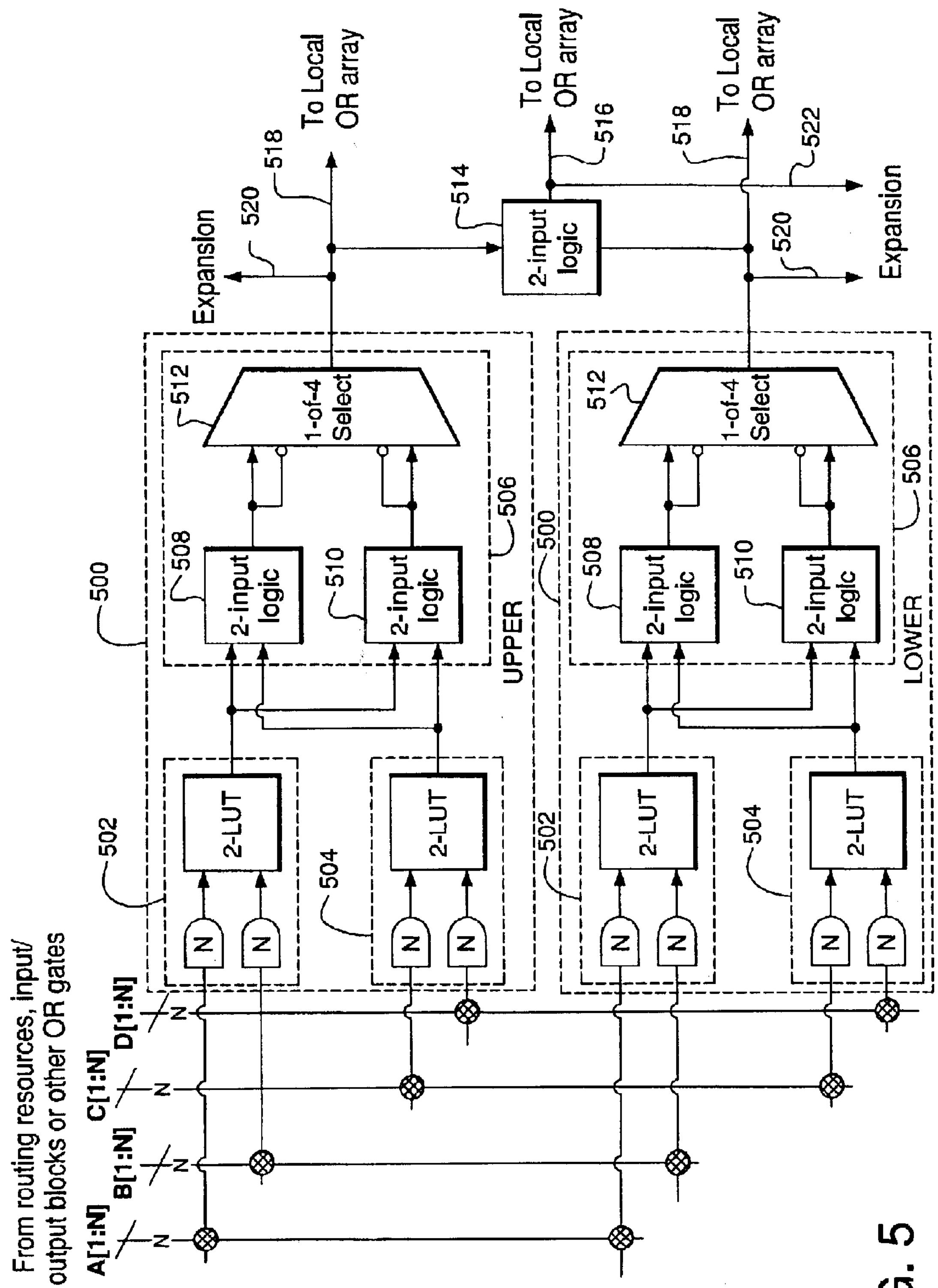
FIG. 5 is a block diagram of an alternative CLBT macro-structure according to another embodiment of this invention.

Yet another embodiment of this invention is illustrated by the macro-CLBT structure of FIG. 5. Here, instances of LBTs 502 and 504 are paired with additional two-input logic structure 506. to form each of upper and lower CLBTs 500. One possible implementation of this logic structure is illustrated by sub-blocks 508, 510, and 512 of two-input logic structure 506. The operations of upper and lower CLBTs 500 are analogous. As shown, LBT 502 outputs to the first input of each of two two-input logic functions 508 and 510, and LBT 504 outputs to the second input of each of logic functions 508 and 510. The outputs of logic functions 508 and 510 and their complements then feed 1-of-4 selector 512. Output 518 of each selector 512 (upper and lower) feeds the local array of sum terms, and possibly other elements of the CPLD via expansion interface 520. Output 518 of upper selector 512 also feeds the first input of two-input logic function 514, while the output of lower selector 512 feeds the other input. Finally, output 516 of logic function 514 also feeds the local sum term array, and via expansion interface 522, other elements of the CPLD.

Figure 6:
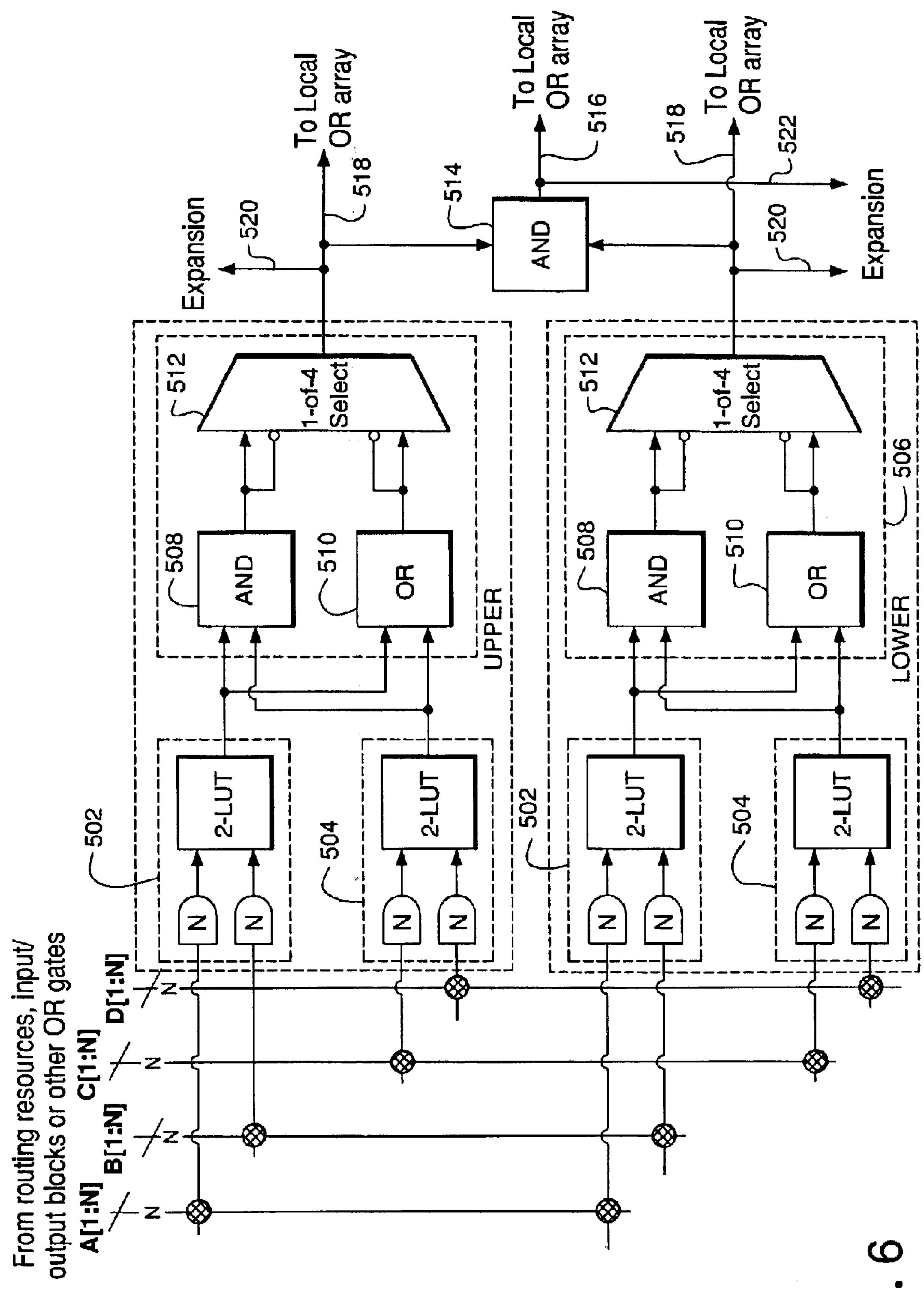
FIG. 6 is a block diagram of one exemplary implementation of the CPLD macro-structure of FIG. 5.

In another implementation of this arrangement, two-input logic function 508 is an AND gate, two-input logic function 510 is an OR gate, and two-input logic function 514 is an AND gate. This implementation is illustrated by FIG. 6. The upper and lower CLBTs of FIGS. 5 and 6 may each be referred to, in the language of this invention, as a 2Nx2-CLBT. Additionally, in both cases, the combination of the upper and lower CLBTs may be referred to as one 4Nx2x2-CLBT.

Figure 7:
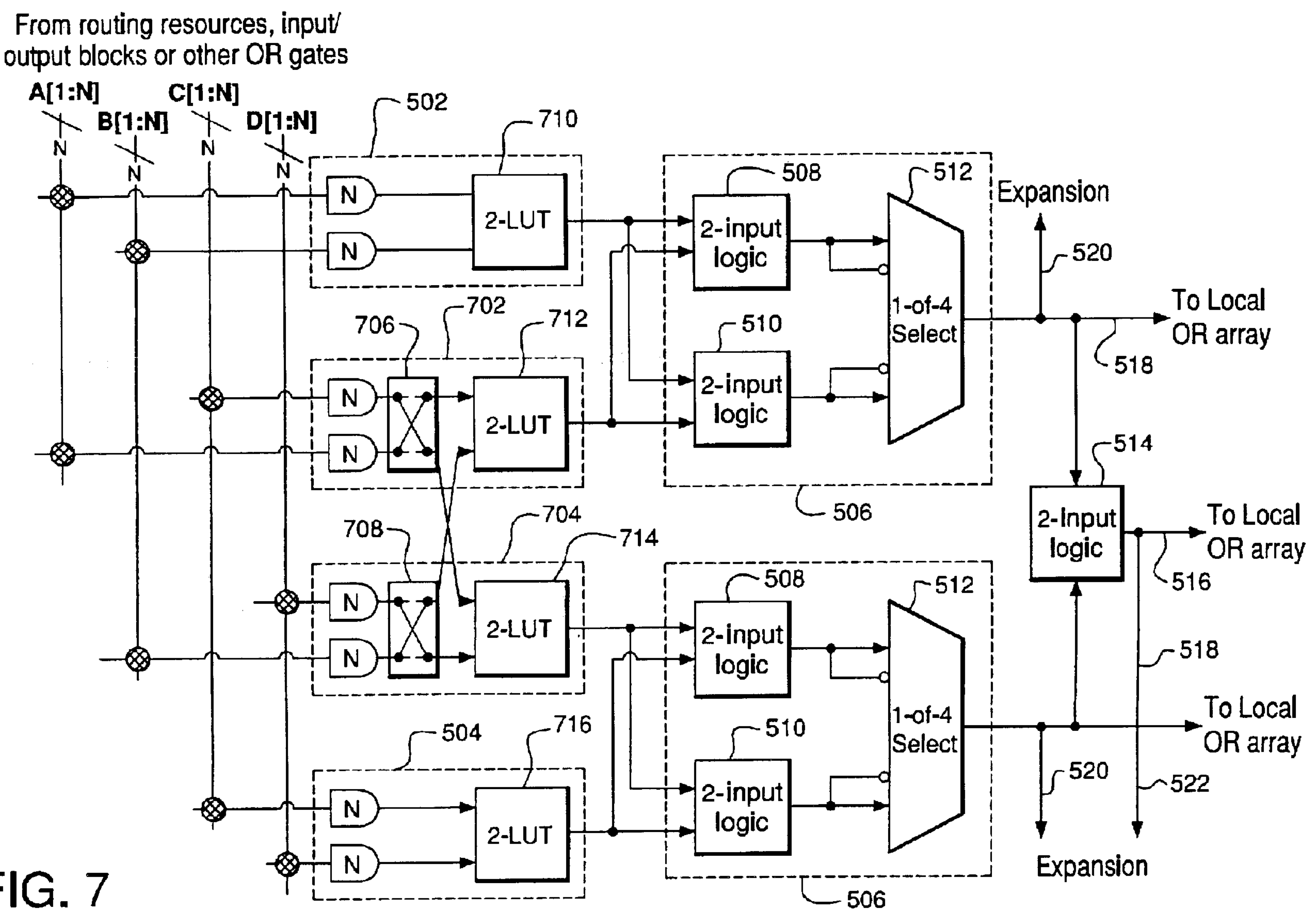
FIG. 7 is a block diagram of another alternative CLBT macro-structure according to another embodiment of this invention.

FIG. 7 illustrates yet another embodiment of this invention. In this embodiment, two-input logic block 506 may be implemented, as illustrated, using two generic two-input logic blocks 508 and 510 and 1-of-4 selector 512, or alternatively using an AND, OR, and 1-of-4 selector as illustrated in FIG E. Elements of this embodiment operate as described with respect to corresponding elements of FIG. 5 with the exception of LBTs 702 and 704. As illustrated, the outputs of the four PTs of the two central LBTs 702 and 704 are optionally, programmably cross-connected (i.e., swapped or shared) via cross-connect elements 706 and 708, respectively. Both cross-connect elements are preferably commonly controlled via programmable fuse or memory elements (not shown) to be in either a straight-through configuration or a crossed configuration.

In the straight-through configuration, the four product terms that feed the upper two 2-LUTs (710 and 712) of the structure are formed from subsets of inputs A[1:N], B[1:N], C[1:N], and D[1:N]. Similarly, in this straight-through configuration, the four product terms that feed the lower two 2-LUTs (714 and 716) of the structure are also formed from subsets of inputs A[1:N], B[1:N], C[1:N], and D[1:N]. Thus, in the straight-through configuration, the device of FIG. 7 is equivalent to the device of FIG. 5 and can be viewed as two 2Nx2-CLBTs, each supporting the implementation of functions of up to 4N/2 or 2N independent inputs (i.e., 2N signals and their 2N complements) and exhibiting the other advantages of that architecture as discussed previously.

In contrast, in the crossed configuration, the four product terms that feed the upper two 2-LUTs (710 and 712) of the structure are formed from subsets of only inputs A[1:N] and B[1:N]. Similarly, in this crossed configuration, the four product terms that feed the lower two 2-LUTs (714 and 716) of the structure are formed from subsets of only inputs C[1:N] and D[1:N].

Figure 4:
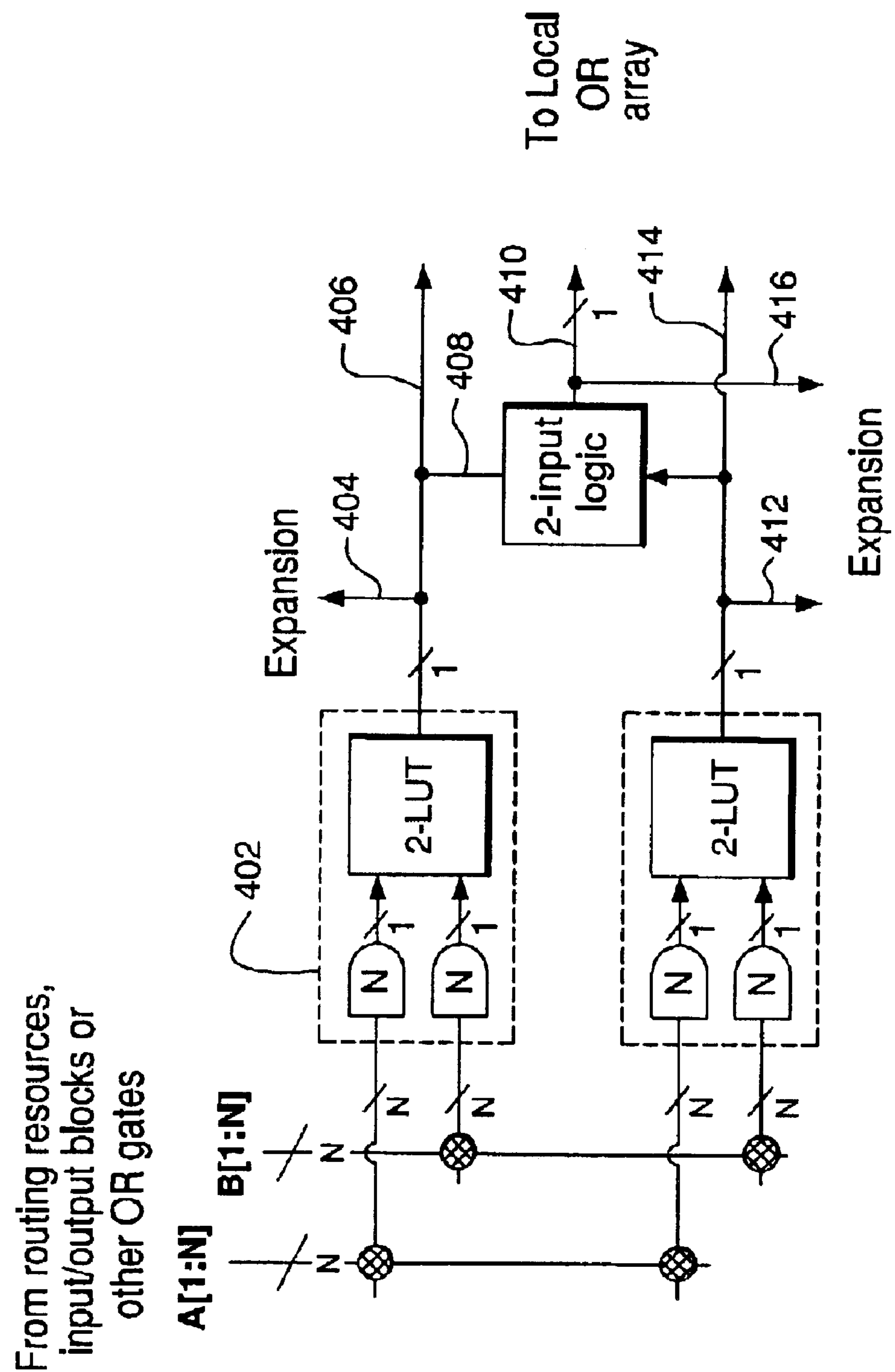
FIG. 4 is a block diagram of a combined LBT (CLBT) macro-structure according to one embodiment of this invention.

Thus, in the crossed configuration, the upper and lower CLBTs of the device of FIG. 7 are each equivalent to the device of FIG. 4 and each can be viewed as one 2Nx2-CLBT, with each supporting the implementation of functions of up to 2N/2 or N independent inputs (i.e., N signals and their N complements) and each exhibiting the other advantages of that architecture, which were discussed previously.

Thus, the device of FIG. 7 can be programmed to behave as either two CLBTs, each capable of supporting functions of up to N independent signals, or as one CLBT capable of supporting functions of up to 2N independent signals.

Because the entire structure is the smallest repeatable element of this structure, this structure may be referred to as an 8Nx1-CLBT.

Note that the configurations found in FIGS. 5, 6, 7, and 8 assume that the signal groups A[1:N], B[1:N], C[1:N], and D[1:N] can be different from each other or the same. This represents a flexible improvement over the prior art. For example a prior art device might have one AND PT with 72 inputs. This can be used for one logical expression. Using the structures of this invention illustrated by FIG. 4 or 5, those 72 inputs maybe broken into two groups of 36 or four groups of 18 and thereby flexibly implement from one to four differently sized logical expressions. Examples include (A[ ]*B[ ]), (A[ ]*B[ ]+C[ ]*D[ ]), and (A[ ]*B[ ]+C[ ]*D[ ]+E[ ]*F[ ]+G[ ]*H[ ])

Dynamic Reconfiguration

Figure 8:
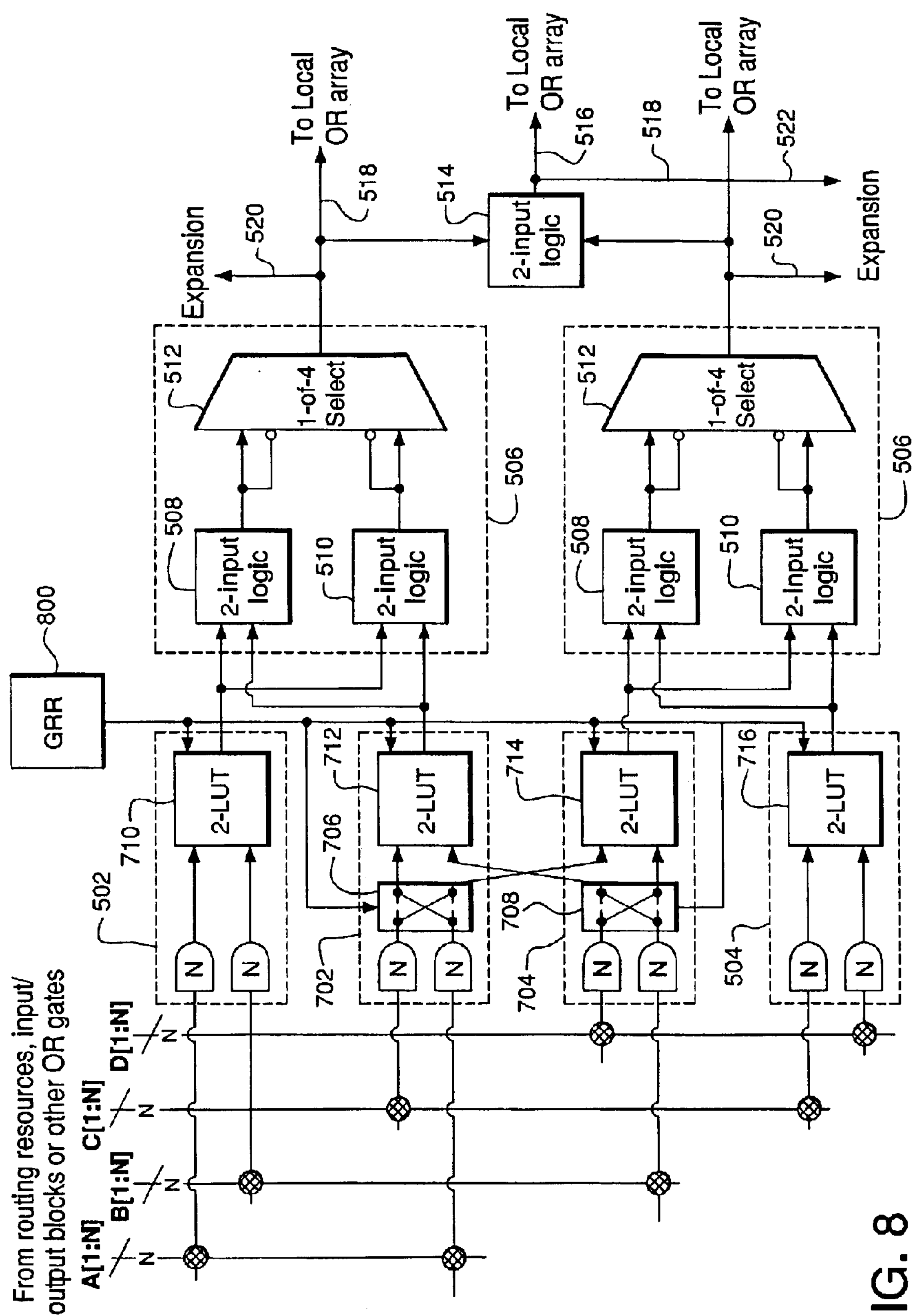
FIG. 8 is a block diagram of yet another alternative CLBT macro-structure according to another embodiment of this invention.

By making the controls for the LUTs and the cross-connect elements of the various embodiments a function of the CPLD inputs and EGLB outputs, additional flexibility, efficiency, and capability can be derived from a CPLD that contains such embodiments. FIG. 8 provides an example of such an embodiment. In FIG. 8, the CLBT of FIG. 7 is shown enhanced by control inputs fed to the LUT and cross-connect elements via GRR 800. As noted previously, the GRR provides a fast carry path for math functions (e.g. addition) and routes the results of logic from other arrays to allow the PT portion of the array to be bypassed for better performance and efficiency. In addition, however, since outputs of each CLBT in the CPLD feed the GRR, it is entirely possible for the CLBT of the embodiment of FIG. 7 to be dynamically reconfigurable as a function of its own outputs or the outputs of another EGLB, if so desired.

For example, by making the control for the cross-connect elements dynamically programmable, support for dynamic bus width switching (e.g., for extensible memory systems) is possible.

While this invention has been described with reference to illustrative embodiments, this description should not be construed in a limiting sense.

Various modifications of the described embodiments, as well as other embodiments of the invention, which are apparent to persons skilled in the art to which the invention pertains are deemed to lie within the principle and scope of the invention as expressed in the following claims.

The term programmable logic device (PLD) as used herein and the scope of application of the architectures discussed in the various embodiments of this invention should be interpreted broadly to include devices that are fuse, antifuse, mask, or memory programmable, and which are factory programmed, field programmed, in-system programmed, or in-circuit programmed. The scope of the term PLD as used herein should be further understood to include field programmable logic devices (FPGAs), complex programmable logic devices (CPLDs), simple programmable logic devices (SPLDs), configurable system-on-a-chip (CSoC) devices, flash-memory-based devices, electrically programmable and electrically erasable or UV-erasable programmable logic devices (EPLDs), and/or SRAM/EPROM/ROM-based devices. Additionally, the embodiments of this invention should be understood to apply equally well to the various known and anticipated logic families such as CMOS, TTL, ECL, Bipolar, GaAs, their low-voltage and differential forms, and hybrid versions thereof.

Many of the example embodiments of the invention describe selection elements that may select up to, for example, Q inputs from an input bus to be fed to a Q-bit wide product term (i.e., a balanced tree of AND gates or equivalent structure). In these examples, it was noted that typically and historically these Q inputs comprise Q/2 independent signals and their complements. The product terms of the structures of this invention should not necessarily be limited in this sense but should be understood to be able to form the product of a full Q independent signals if so desired.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, microcontroller, or general-purpose computer.

What is claimed is:

1. A programmable logic device (PLD) having one or more enhanced generic logic blocks (EGLBs), each EGLB comprising:

(a) a LUT-based Boolean term (LBT) array connected to receive a plurality of array input signals and generate one or more array output signals, each array output signal corresponding to a combinatorial function of one or more of the array input signals; and (b) one or more sum terms, each sum term connected to receive one or more of the array output signals and generate a combinatorial sum of its input signals, wherein:

the LBT array comprises a plurality of selection elements and a plurality of LBTs;

each selection element is adapted to selectively provide one or more of the array input signals to an LBT;

each LBT comprises P product terms and a P-input look-up table (P-LUT);

P is an integer greater than one;

each product term is adapted to generate a combinatorial product of one or more array input signals selectively provided by a corresponding selection element; and each P-LUT is connected to receive the combinatorial products from the corresponding P product terms and generate a programmable combinatorial function of the P product terms.

2. The invention of claim 1, wherein the LBT array comprises one or more combined LBTs (CLBTs), each CLBT comprising a plurality of LBTs connected to a plurality of multiple-input logic functions connected to a selector, wherein:

an output of each LBT feeds an input of each multiple-input logic function; and outputs of the multiple-input logic functions and the complements of those outputs feed the selector to generate one or more of the array output signals.

3. The invention of claim 2, wherein at least one CLBT comprises first and second LBTs connected to first and second two-input logic functions connected to a 1-of-4 selector, wherein:

an output of the first LBT feeds a first input of the first two-input logic function and a first input of the second two-input logic function;

an output of the second LBT feeds a second input of the first two-input logic function and a second input of the second two-input logic function; and outputs of the first and second two-input logic functions and the complements of those outputs feed the 1-of-4 selector to generate one or more of the array output signals.

4. The invention of claim 3, wherein the LBT array comprises first and second CLBTs and an additional two-input logic function, wherein outputs of the first and second CLBTs feed the additional two-input logic function, which generates one or more of the array output signals.

5. The invention of claim 4, wherein:

the first two-input logic function is adapted to perform an AND function;

the second two-input logic function is adapted to perform an OR function; and the additional two-input logic function is adapted to perform an AND function.

6. The invention of claim 2, wherein the LBT array comprises at least first and second CLBTs, wherein at least one product term of the first CLBT is shared with at least one LUT of the second CLBT.

7. The invention of claim 2, wherein the LBT array comprises first and second CLBTs and an additional two-input logic function, wherein outputs of the first and second CLBTs feed the additional two-input logic function, which generates one or more of the array output signals.

8. The invention of claim 1, wherein the LBT array comprises additional logic connected to receive one or more outputs from one or more of the LBTs to generate one or more of the array output signals.

9. The invention of claim 8, wherein the additional logic comprises one or more two-input logic functions, each connected to receive outputs from an associated pair of LBTs.

10. The invention of claim 9, wherein at least one of the two-input logic functions is a 2-LUT.

11. The invention of claim 9, wherein at least one of the two-input logic functions is an AND gate.

12. The invention of claim 1, wherein the LBT array comprises first, second, third, and fourth LBTs connected to first, second, third, and fourth two-input logic functions connected to first and second 1-of-4 selectors, wherein:

each of the first and fourth LBTs comprises two product terms feeding a 2-LUT;

each of the second and third LBTs comprises two product terms feeding a 2×2 cross-connect element feeding a 2-LUT, wherein:

a first output of the cross-connect element of the second LBT feeds a first input of the 2-LUT of the second LBT;

a second output of the cross-connect element of the second LBT feeds a first input of the 2-LUT of the third LBT;

a first output of the cross-connect element of the third LBT feeds a second input of the 2-LUT of the second LBT; and a second output of the cross-connect element of the third LBT feeds a second input of the 2-LUT of the third LBT;

an output of the first LBT feeds a first input of the first logic function and a first input of the second logic function;

an output of the second LBT feeds a second input of the first logic function and a second input of the second logic function;

an output of the third LBT feeds a first input of the third logic function and a first input of the fourth logic function;

an output of the fourth LBT feeds a second input of the third logic function and a second input of the fourth logic function;

an output of the first logic function and its complement feed the first 1-of-4 selector;

an output of the second logic function and its complement feed the first 1-of-4 selector;

an output of the third logic function and its complement feed the second 1-of-4 selector;

an output of the fourth logic function and its complement feed the second 1-of-4 selector;

the first and second 1-or-4 selectors generate two or more of the array output signals.

13. The invention of claim 12, wherein the cross-connect elements of the second and third LBTs are controlled dynamically based on one or more array outputs of one or more PTL arrays within the PLD.

14. The invention of claim 12, wherein the LBT array further comprises an additional two-input logic function, wherein outputs of the first and second 1-of-4 selectors feed the additional two-input logic function, which generates one or more of the array output signals.

15. The invention of claim 1, wherein the PLD further comprises a generic routing resource adapted to route one or more of the array output signals to one or more elements of the PLD.

16. The invention of claim 15, wherein one of the elements is a different EGLB of the PLD.

17. The invention of claim 15, wherein one of the elements is the same EGLB.

18. The invention of claim 1, wherein the P-LUT is adapted to perform a dynamic function of one or more of the array outputs of one or more LBT arrays within the PLD.

19. The invention of claim 18, wherein at least one of the one or more LBT arrays is located in a different EGLB of the PLD.

20. The invention of claim 1, the programmable combinatorial function is one of a plurality of available combinatorial functions selected by programming the P-LUT.

21. The invention of claim 1, wherein:

P=2 and each LBT comprises two product terms and a 2-LUT; and the LBT array comprises two selection elements for each LBT, each selection element adapted to selectively provide one or, more of the array input signals to a different one of the two product terms in the corresponding LBT.

* * * * *